(12) United States Patent
Kim et al.

(10) Patent No.: US 7,800,423 B2
(45) Date of Patent: Sep. 21, 2010

(54) DUTY CORRECTION CIRCUIT

(75) Inventors: Kyung-Hoon Kim, Gyeonggi-do (KR); Bo-Kyeom Kim, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 12/343,753

(22) Filed: Dec. 24, 2008

(65) Prior Publication Data

US 2009/0284293 A1 Nov. 19, 2009

(30) Foreign Application Priority Data

May 19, 2008 (KR) .................... 10-2008-0045978

(51) Int. Cl.
*H03K 3/017* (2006.01)
(52) U.S. Cl. ...................... 327/175; 327/172
(58) Field of Classification Search ............ None
See application file for complete search history.

(56) References Cited

U.S. PATENT DOCUMENTS

| | | | |
|---|---|---|---|
| 6,853,225 B2 | 2/2005 | Lee | |
| 6,859,081 B2 | 2/2005 | Hong et al. | |
| 6,937,485 B2 * | 8/2005 | Suzuki et al. | 363/41 |
| 6,963,235 B2 | 11/2005 | Lee | |
| 7,015,739 B2 * | 3/2006 | Lee et al. | 327/175 |
| 7,180,346 B2 * | 2/2007 | Lee | 327/175 |
| 7,221,204 B2 * | 5/2007 | Kim et al. | 327/175 |
| 7,312,647 B2 * | 12/2007 | Choi et al. | 327/175 |
| 7,612,593 B2 * | 11/2009 | Kim et al. | 327/175 |
| 2004/0066873 A1 | 4/2004 | Cho et al. | |
| 2006/0197565 A1 | 9/2006 | Kang | |

FOREIGN PATENT DOCUMENTS

| | | |
|---|---|---|
| JP | 2004-129255 | 4/2004 |
| KR | 1998-053622 | 9/1998 |
| KR | 1020070111786 A | 11/2007 |

* cited by examiner

*Primary Examiner*—Cassandra Cox
(74) *Attorney, Agent, or Firm*—IP & T Law Firm PLC

(57) ABSTRACT

A duty correction circuit includes a duty ratio sensor for controlling a duty ratio sensing speed by a sensing speed control signal and outputting a correction signal by sensing a duty ratio of a clock, and a duty ratio corrector for controlling the duty ratio of the clock in response to the correction signal.

20 Claims, 14 Drawing Sheets

DUTY CORRECTION CIRCUIT

CROSS-REFERENCE TO RELATED APPLICATIONS

This application claims priority to Korean patent application number 10-2008-45978, filed on May 19, 2008, which is incorporated by reference in its entirety.

BACKGROUND OF THE INVENTION

The present subject matter relates to a duty correction circuit, and more particularly, to a duty correction circuit for increasing a duty ratio sensing speed as occasion demands.

A duty ratio is a ratio of a pulse width to a pulse cycle of a clock. A clock having a duty ratio of 50% is generally used in digital clock application fields such as a semiconductor integrated circuit. The duty ratio of 50% means that a width of a high level clock period is identical to a width of a low level clock period. The duty correction circuit corrects a duty ratio of a clock to be a duty ratio of 50% if an input clock has an incorrect duty ratio.

In the digital clock application fields, it is important to precisely control the duty ratio of a clock. If the duty ratio of a clock is not accurately controlled in a synchronous semiconductor device that synchronizes with a clock to input and output data, data may be distorted. Lately, a double data rate (DDR) synchronous semiconductor device has been used in order to increase an operation speed. A double data rate (DDR) scheme enables a semiconductor device to input and output data not only at a rising edge of a clock but also at a falling edge. Therefore, the duty ratio is more important in a DDR synchronous semiconductor device to secure a data margin.

FIG. 1 is a diagram illustrating a duty correction circuit according to the prior art.

Referring to FIG. 1, the duty correction circuit according to the prior art includes a duty ratio sensor 101 and a duty ratio corrector 103.

Still referring to FIG. 1, the duty ratio sensor 101 includes a charging/discharging unit 105, first and second charge storing units 107 and 109, a reset unit 111, and an activator 113. The charging/discharging unit 105 charges or discharges the first and second charge storing units 107 and 109 according to a duty ratio of a clock CLKOUT and a complementary clock CLKOUTB, which are fed back from the duty ratio corrector 103 and generates a first and a second correction signals A and B. The first and second charge storing units 107 and 109 are connected to an output end of the duty ratio sensor 101 and charged or discharged thereby. The first and second charge storing units 107 and 109 control a logical level transition speed of the first and second correction signals A and B. The reset unit 111 resets the first and second correction signals A and B to a high level in response to a sensing signal EN. The activator 113 activates the duty ratio sensor 101 in response to the sensing signal EN.

When the sensing signal EN is enabled to a high level, a transistor of the activator 113 is turned on and the duty ratio sensor 101 starts operating thereby. Since the reset unit 111 is turned on before the sensing signal EN is initially enabled to a high level, both of the first and second correction signals A and B are high level signals.

The duty ratio corrector 103 operates in response to level transition of the first and second signals A and B. Therefore, once the sensing signal EN is enabled, the sensing signal EN sustains the enable state continuously. However, if the duty ratio corrector 103 operates according to whether the first and second correction signals A and B are shifted to the opposite level or not, the sensing signal EN is regularly enabled and the duty ratio sensor 101 is reset by the reset unit 111. Since the duty ratio is corrected by determining whether a level is shifted or not, it is required to reset the first and second charge storing units 107 and 109 continuously in order to shift the levels of the first and second corrections again.

The reset unit 111 is turned off in an enable period of the sensing signal EN. If the clock CLKOUT is inputted as a high level, an NMOS transistor T1 receiving the clock CLKOUT is turned on. Also, an NMOS transistor T2 connected in serial is turned on because a drain voltage of the NMOS transistor T1 is dropped. Therefore, the first correction signal A transits to a low level. However, the first correction signal A gradually transits because the first charge storing unit 107 does not let the correction signal A to abruptly transit.

The complementary clock CLKOUTB has an opposite level to the clock CLKOUT. That is, the complementary clock CLKOUTB has a low level during a high level period of the clock CLKOUT. If the complementary clock CLKOUTB is inputted with a low level, an NMOS transistor T3 receiving the complementary clock CLKOUTB is not turned on and the second correction signal B is not changed.

If the complementary clock CLKOUTB is inputted with a high level, the NMOS transistor T3 receiving the complementary clock CLKOUTB and an NMOS transistor T4 connected to T3 in series are turned on. Although the second correction signal B transits to a low level, the level thereof gradually falls by the second charge storing unit 109.

If the duty ratio of the clock CLKOUT and the complementary clock CLKOUTB is not 50%, the logical level transition of the first correction signal A becomes different from that of the second correction signal B. If the low level period of the clock CLKOUT is wider than the high level period thereof, the logical level of the second correction signal B is dropped more by the complementary clock CLKOUTB. Then, the second correction signal B turns on a PMOS transistor T5 of the charging/discharging unit 105 and the first correction signal A rises to a high level. Finally, the first and second signals A and B are shifted to inverted levels due to the duty ratio difference between the clock CLKOUT and the complementary clock CLKOUTB.

The duty ratio corrector 103 includes NMOS transistors T9 and T7 for receiving a clock CLKIN and a complementary clock CLKINB respectively and PMOS transistors T6 and T8 receiving the first and second correction signals A and B respectively. The NMOS transistors T9 and T7 and the PMOS transistors T6 and T8 are connected in serial. Here, the transistor T8 receiving the first correction signal A is connected to the transistor T7 receiving a complementary clock and the transistor T6 receiving the second correction signal B is connected to the transistor T9 receiving an clock CLKIN.

The first and second correction signals A and B may have different levels according to the duty ratio. Such a difference can turn on the NMOS transistors T6 and T8. For example, as shown in FIG. 1, the first correction signal A transits to a high level and the second correction signal B transits to a low level due to a wide low level period of the clock CLKIN. Therefore, the NMOS transistor T8 receiving the first correction signal A is turned on strongly in process of time, and the NMOS transistor T6 receiving the second correction signal B is turned on weakly in process of time.

If the transistors T6 and T8 receiving the first and second correction signals A and B are not included, the complementary clock CLKOUTB is outputted by receiving the clock CLKIN, and the clock CLKOUT is outputted by receiving the complementary clock CLKINB. However, the high level period of the clock CLKOUT extends because the first correction signal A turns on the transistor T8 strongly. And, the low level period of the complementary clock CLKOUTB extends because the second correction signal B turns on the transistor T6 weakly.

Therefore, a complementary clock output end and a clock output end output the complementary clock CLKOUTB and the clock CLKOUT with duty ratio corrected although the complementary clock output received an clock CLKIN having a wide low level period and outputted a complementary clock CLKOUTB and the clock output end received a complementary clock having a wide high level period and outputted the clock CLKOUT having the extended wide low level period.

It is required to correct a duty ratio fast in a particular mode such as a self-refresh mode or a power-up mode of a DRAM, compared with a normal mode. It is important to sustain system performance.

However, the duty correction circuit according to the prior art corrects the duty ratio at a uniform speed. That is, a speed of duty ratio correction is identical not only in a normal mode but also in a particular mode such as a power up mode or a self refresh mode.

If the duty ratio correction speed is set to be high for the self-refresh mode or the power-up mode, a time for correcting a duty ratio can be reduced. However, the high duty ratio correction speed may cause high jitter and increase instability of a system because the high duty ratio correction speed increases a clocking speed even in a normal mode which does not require the high duty ratio correction speed.

SUMMARY OF THE INVENTION

Embodiments of the present invention are directed to providing a duty correction circuit for dynamically controlling a duty ratio sensing speed to increase or decrease the duty ratio sensing speed as occasion demands.

In accordance with an aspect of the disclosure, there is provided a duty correction circuit including a duty ratio sensor for controlling a duty ratio sensing speed by a sensing speed control signal and outputting a correction signal by sensing a duty ratio of a clock, and a duty ratio corrector for controlling the duty ratio of the clock in response to the correction signal.

The duty ratio sensor may generate the correction signal that is charged/discharged and enabled in response to a clock or a complementary clock, and an amount of current flowing to the duty ratio sensor may be controlled by the sensing speed control signal.

The duty ratio sensor may include a first charge storing unit charged or discharged in response to a clock, and a second charge storing unit charged or discharged in response to a complementary clock, and output the correction signal that is enabled in response to charge amounts of the first and second charge storing units, and the respective capacitances of the first and second charge storing units may be controlled by the sensing speed control signal.

In accordance with another aspect of the disclosure, there is provided a duty ratio correction circuit including a duty ratio sensing unit having a duty ratio sensing speed controlled by a sensing speed control signal and outputting a correction signal by sensing a width between rising edges of a clock and a complementary clock, and a corrector for correcting the clock and the complementary clock to have a phase difference of 180° in response to the correction signal.

DESCRIPTION OF SPECIFIC EMBODIMENTS

Other objects and advantages of the present subject matter can be understood by the following description, and become apparent with reference to the embodiments of the present invention.

Figure 2:
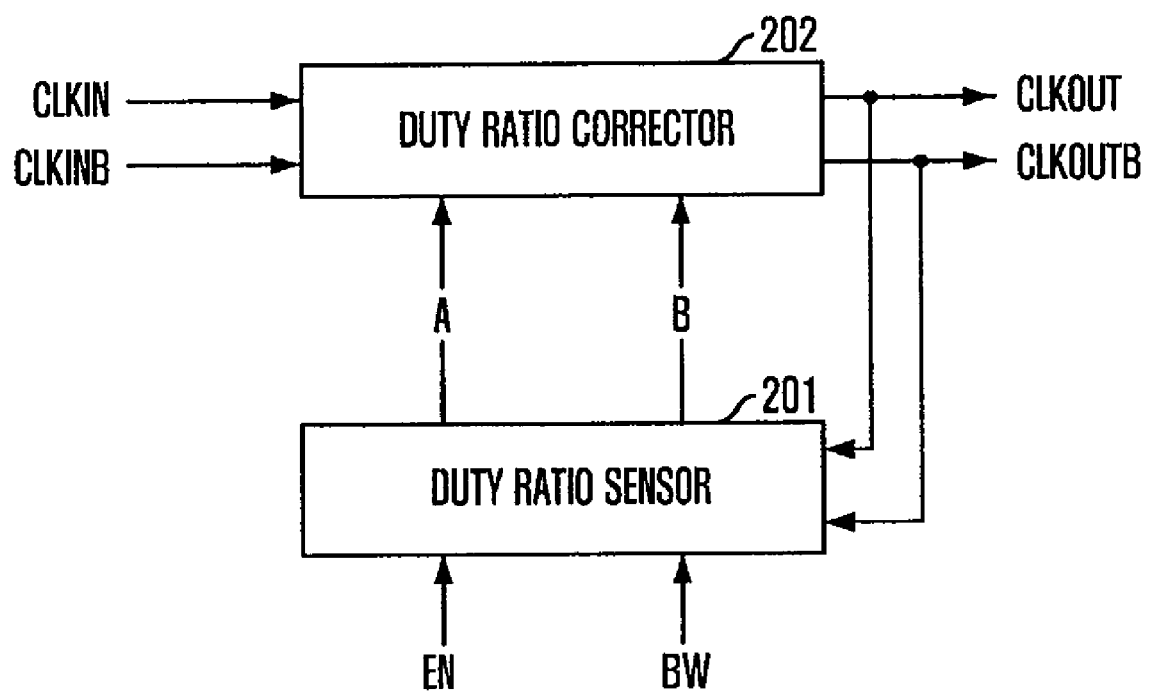
FIG. 2 is a block diagram illustrating a duty correction circuit in accordance with an embodiment of the present invention.

FIG. 2 is a block diagram illustrating a duty correction circuit in accordance with an embodiment of the present invention.

As shown in FIG. 2, the duty correction circuit according to the present embodiment includes a duty ratio sensor 201 and a duty ratio corrector 202. The duty ratio sensor 201 controls a duty ratio sensing speed in response to a sensing speed control signal BW, senses duty ratios of a clock CLKIN and a complementary clock CLKINB, and outputs the correction signals A and B. The duty ratio corrector 202 controls the duty ratio of the clocks CLKIN and CLKINB in response to the correction signals A and B.

The duty ratio sensing speed means a speed of enabling the correction signals A and B.

"CLKIN" and "CLKINB" denote an input clock signal and a complementary clock signal inputted to the duty ratio corrector 202 and the input clock CLKIN and the complementary clock signal CLKINB have incorrect duty ratios. Also, "CLKOUT" and "CLKOUTB" denote an output clock signal and a complementary clock signal outputted from the duty ratio corrector 202 and the output clock signal CLKOUT and the complementary clock signal CLKOUTB have corrected duty ratios.

Unlike the prior art, the duty correction circuit according to the present embodiment receives a sensing speed control signal BW. The duty ratio sensor 201 generates the correction signals A and B in response to the output clock CLKOUT and the complementary clock CLKOUTB outputted from the duty ratio corrector 202. The duty ratio sensor 201 generates the correction signals A and B that are charged or discharged and enabled in response to the output clock CLKOUT and the complementary clock CLKOUTB. An amount of current flowing to the duty ratio sensor 201 is controlled by the sensing speed control signal BW. That is, the sensing speed control signal BW controls a duty ratio sensing speed of the duty ratio sensor 201 by controlling the current amount of the duty ratio sensor 201. The output clock CLKOUT is an inverted clock of the output complementary clock CLKOUTB. The duty ratio corrector 202 outputs the output clock CLKOUT and the output complementary clock CLKOUTB after correcting the duty ratios thereof.

Since the duty ratio sensor 201 outputs the correction signals A and B that are charged or discharged and enabled in response to the output clock CLKOUT and complementary clock signal CLKOUTB, a speed of charging and discharging is controlled by controlling the current amount of the duty ratio sensor 201. That is, a speed of enabling a duty ratio correction signal is controlled.

To be specific, if the amount of current following to the duty ratio sensor 201 increases, an electric charge amount increases and the speed of charging and discharge increases as well. The increment of the charging/discharging speed means that the correction of the duty ratio is enabled fast. That is, the duty ratio sensing speed becomes fast, and the duty ratio corrector 202 detects the level transition of the correction signal and corrects the duty ratio.

The amount of current flowing to the duty ratio sensor 201 is controlled by the sensing speed control signal BW.

The sensing speed control signal BW may be a power-up signal or a self-refresh signal.

Figure 1:
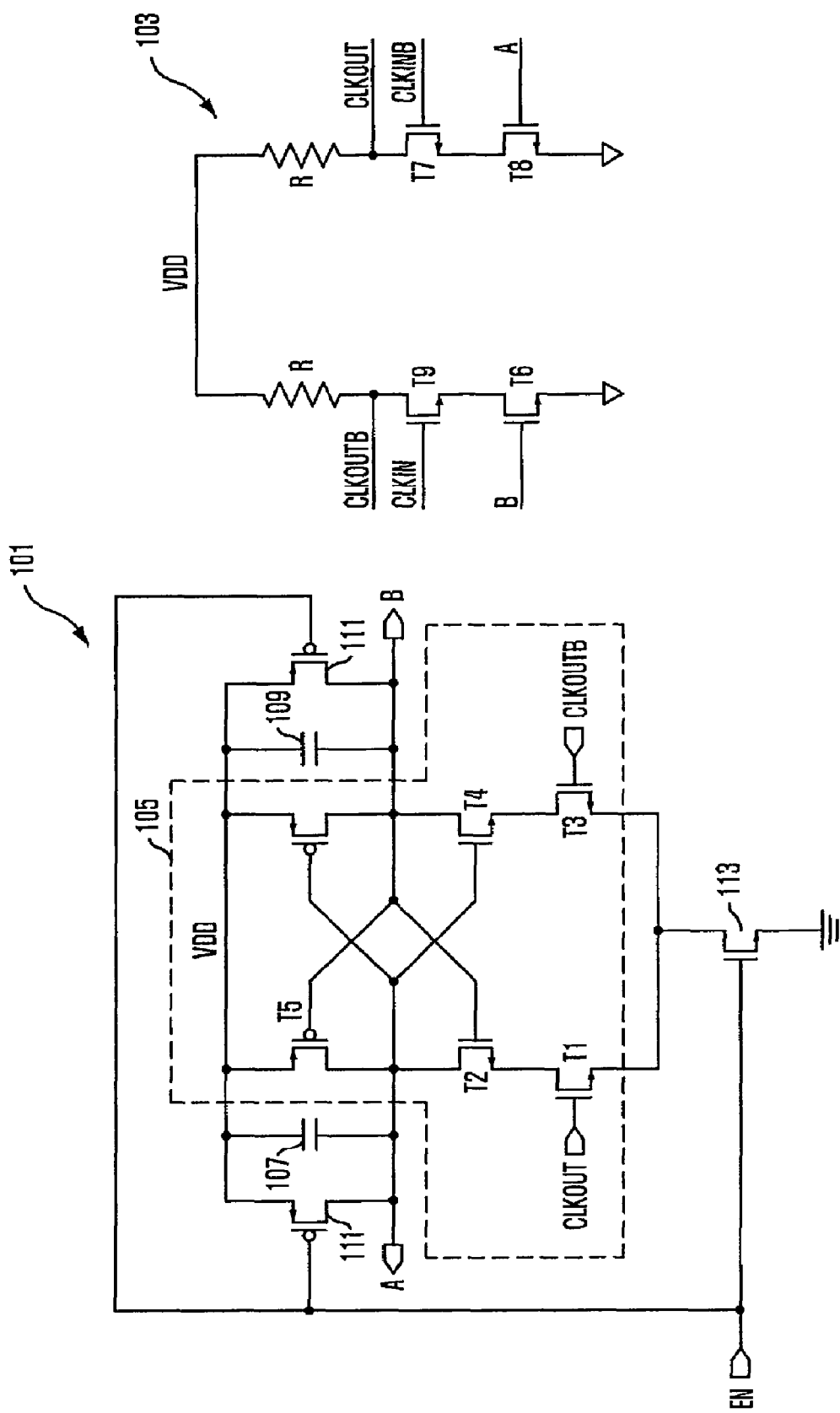
FIG. 1 is a diagram illustrating a duty correction circuit according to the prior art.

As shown in FIG. 1, the duty ratio corrector 103 according to the prior art corrects a duty ratio by receiving the correction signals A and B of the duty ratio sensor 101 and the duty ratio sensor 101 has a uniform duty ratio sensing speed. Therefore, the duty correction circuit according to the prior art always has the uniform duty ratio sensing speed although it is necessary to increase the duty ratio correction speed in a sensing speed increment mode such as a power-up mode or a self-refresh mode of a semiconductor device.

Unlike the prior art, the duty correction circuit according to the present embodiment receives the power-up signal or the self-refresh signal as the sensing speed control signal BW and increases the duty ratio sensing speed in a power up mode or a self-refresh mode of a semiconductor device by increasing an amount of current flowing through the duty ratio sensor 201.

Figure 3A:
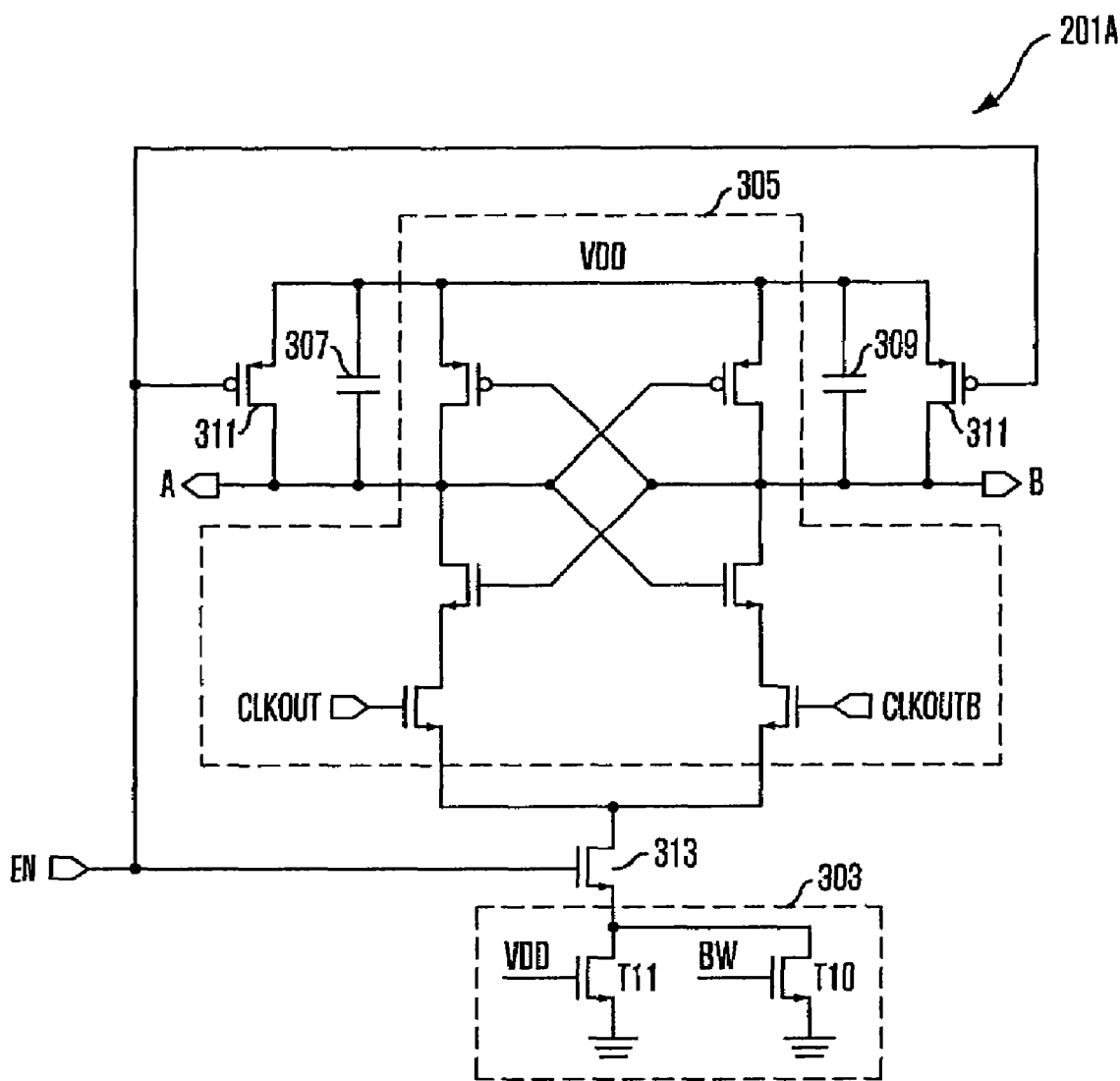
FIG. 3A is a first exemplary circuit illustrating a duty ratio sensor of FIG. 2.

FIG. 3A is a first exemplary circuit illustrating a duty ratio sensor 201 of FIG. 2.

As shown in FIG. 3A, the duty ratio sensor 201A includes a charging and discharging unit 305, charge storing units 307 and 309, a sensing speed controller 303, a reset unit 311, and an activator 313. The charging and discharging unit 305 generate correction signals A and B according to duty ratios of a clock CLKOUT and a complementary clock CLKOUTB. The charge storing units 307 and 309 are connected to an output end of the duty ratio sensor 201A and controls logical level transition speeds of the correction signals A and B by being charged or discharged. The sensing speed controller 303 controls the speed of charging or discharging the charge storing units 307 and 309 by controlling the amount of current flowing to the duty ratio sensor 201A in response to the sensing speed control signal BW. The reset unit 311 resets the correction signals A and B to a high level in response to the sensing signal EN. The activator 313 activates the duty ratio sensor 201A in response to the sensing signal EN.

Still referring to FIG. 3, the duty ratio sensor 201A further includes the sensing speed controller 303 with the same constituent elements as the duty ratio sensor 101 of FIG. 1. The sensing speed controller 303 includes a transistor T10 that is turned on in response to the sensing speed control signal BW and increases the amount of current flowing to the duty ratio sensor 201A. The transistor T10 is connected to a transistor T11, which is turned on by a supply voltage Vdd, in parallel. However, the transistor T10 may be connected to the activator 313 in parallel.

The duty ratio sensing speed may increase by controlling the amount of current flowing to the duty ratio sensor 201A. As shown in FIG. 1, the correction signals A and B are gradually shifted because the correction signals A and B are shifted while the first and second charge storing units 307 and 309 are charged or discharged by the clock CLKOUT and the complementary clock CLKOUTB. Since the first and second charge storing units 307 and 309 can be charged faster if the amount of current flowing to the duty ratio sensor 201 and the speed of charging and discharging increases. Therefore, the levels of the correction signals A and B are shifted much faster; thereby the sensing speed of the duty ratio sensor 201A becomes fast.

To be specific, in the sensing speed increment mode such as a power up mode or a self refresh mode, the sensing speed control signal BW turns on the NMOS transistor T10 of the sensing speed controller 303. The NMOS transistor T10 is connected to the NMOS transistor T11 receiving the supply voltage Vdd in parallel, and the amount of current flowing to the duty ratio sensor 201 increases because a path of flowing current increases when the NMOS transistor T10 is turned on.

Therefore, the charging and discharging speeds of the first and second charge storing units 307 and 309 become fast, the sensing speed becomes fast, and the level transition of the correction signals A and B become fast, too. As a result, the duty ratio correction speed becomes fast. The duty ratio corrector 202 receives the correction signals A and B and corrects the duty ratio of a clock.

The duty ratio corrector 202 operates in response to the level transition of the correction signals A and B like the duty ratio corrector 103 of FIG. 1. Or, the duty ratio corrector 202 determines whether the levels of the correction signals A and B are shifted to the opposite levels or not and operates according to the determination results.

Here the self refresh mode signal or the power up mode signal are control signals that increase a sensing speed by driving the duty ratio corrector 201A in the sensing speed increment mode. In the sensing speed increment mode, the sensing speed increment signal BW increases the amount of current flowing to the duty ratio sensor 201A, thereby making the correction signals A and B to transit faster. Therefore, the duty ratio sensing speed increases in the sensing speed increment mode. However, in a normal mode, the duty ratio correction circuit according to the present embodiment has a normal duty ratio sensing speed.

When the sensing signal is enabled, the activator 313 is turned on and applies current to the duty ratio sensor.

Figure 3B:
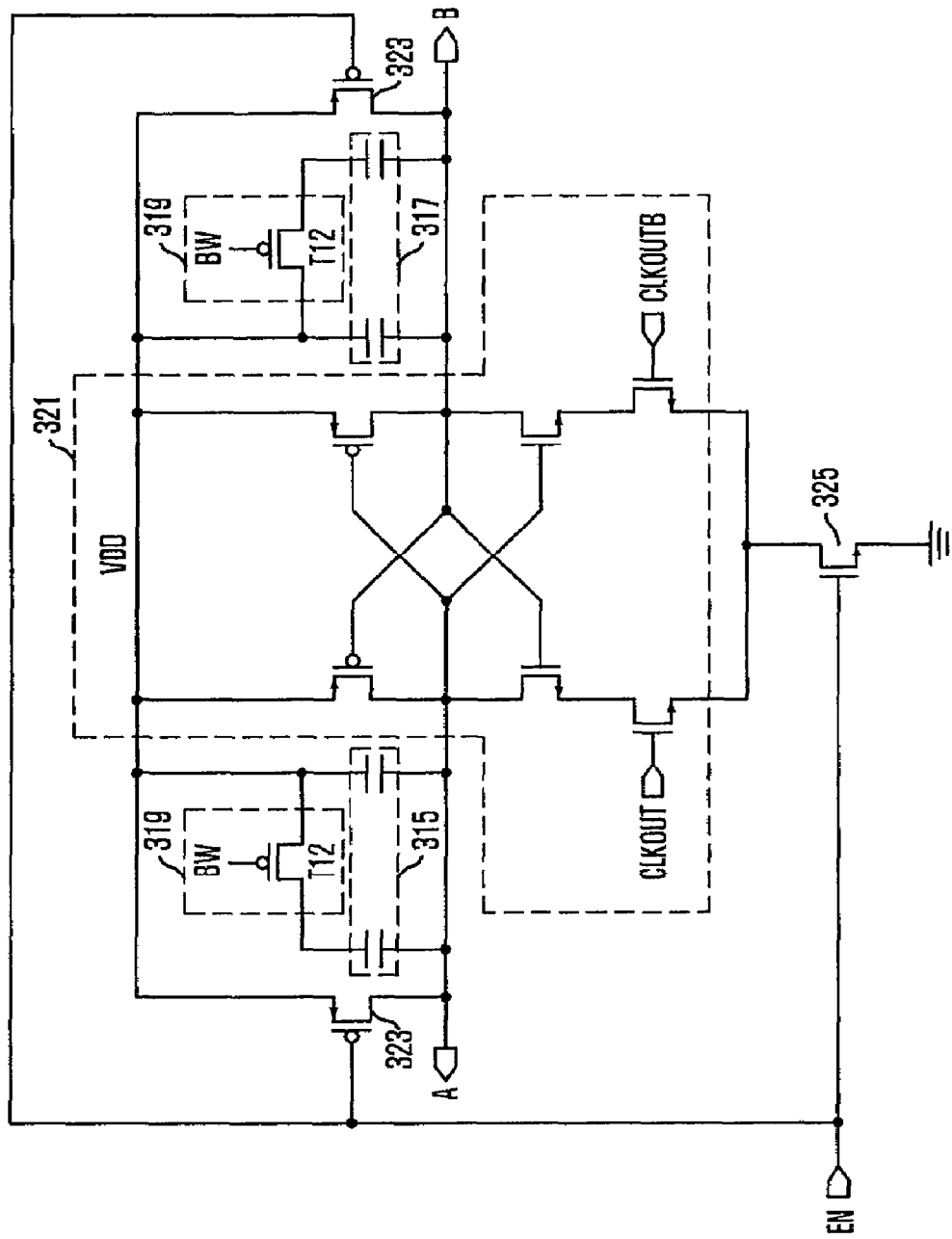
FIG. 3B is a second exemplary circuit illustrating a duty ratio sensor of FIG. 2.

FIG. 3B is a second exemplary circuit illustrating a duty ratio sensor of FIG. 2.

Unlike the duty ratio sensor of FIG. 3A, the duty ratio sensor 201B of FIG. 3B includes a first charge storing unit 315 charged or discharged in response to the clock CLKOUT and a second charge storing unit 317 charged or discharged in response to the complementary clock CLKOUTB. The first and second charge storing units 315 and 317 output correction signals A and B enabled in response to charge current, and capacitance of the first and second charge storing units 315 and 317 are controlled by the control signal BW.

In this case, the duty ratio sensing speed increases by controlling the capacitance of the first and second charge storing units 315 and 317. Since the first and second charge storing units 315 and 317 cannot store charge more if the capacitance of the first and second charge storing units 315 and 317 decrease, the logical levels of the correction signals A and B transit fast. That is, the sensing speed of the duty ratio sensor 201B increases, and the duty ratio correction speed of the duty ratio corrector 202 also increases.

Referring to FIG. 3B, the duty ratio sensor 201B includes a charging and discharging unit 321, first and second charge storing units 315 and 317, a sensing speed controller 319, a reset unit 323, and an activator 323. The charging and discharging unit 321 generates the correction signals A and B according to the duty ratios of the clocks CLKOUT and CLKOUTB. The first and second charge storing units 315 and 317 are connected to the output end of the duty ratio controller 201B and control the logical level transition speed of the correction signals A and B while being charged or discharged. The sensing speed controller 319 controls the sensing speed of the duty ratio sensor 201B by controlling the capacitance of the first and second charge storing units 315 and 317 in response to the sensing speed control signal BW. The reset unit 323 resets the correction signals A and B to a high level in response to the sensing signal EN. The activator 325 activates the duty ratio sensor 201B in response to the sensing signal EN.

Although the duty ratio sensor 201B of FIG. 3B also includes the sensing speed controller 319 like FIG. 3A, the structure of the sensing speed controller 319 is different from that of FIG. 3A. The sensing speed controller 319 is turned off in response to the sensing speed control signal BW and includes a PMOS transistor T12 that reduces the capacitance of the first and second charge storing units 315 and 317 when the sensing speed controller 319 is turned off. Unlike FIG. 3A, the first and second charge storing units 315 and 317 include two capacitors connected in parallel which may be shorted by the sensing speed controller 319.

In a sensing speed increment mode, the sensing speed control signal BW turns off the PMOS transistor T12 of the sensing speed controller 319, and the connection of two capacitors of the first and second charge storing units 315 and 317 is shorted. The capacitance of the capacitors increases when the two capacitors are connected in parallel or decreases when the connection thereof is shorted. Therefore, the level transition of the correction signals A and B becomes fast, and the duty ratio correction speed also become fast because the amount of charge in the first and second charge storing units 315 and 317 is reduced when the capacitors are connected in parallel.

Unlike the duty ratio sensor 201 of FIG. 3A that increases the charging and discharging speed of the first and second charge storing units 307 and 30 by increasing the amount of current flowing to the duty ratio sensor 201A to increase the charging and discharging speed of the first and second charge storing units 307 and 309, the duty ratio sensor 201B of FIG. 3B increases the sensing speed by reducing the capacitance of the first and second charge storing units 315 and 317.

Figure 4:
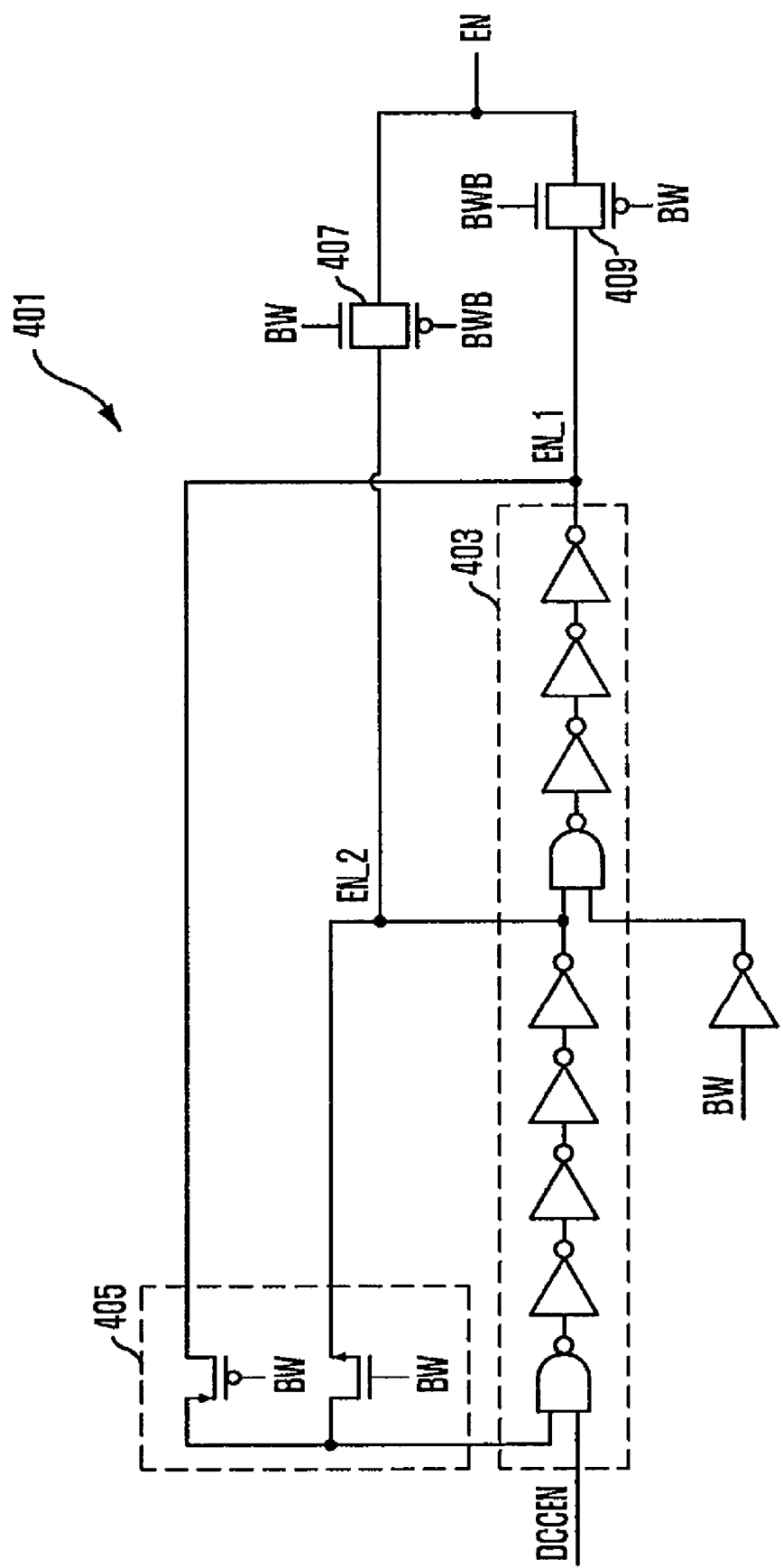
FIG. 4 is a diagram illustrating a sensing signal generator for generating a sensing signal that is applied to a duty ratio sensor of FIGS. 3A and 3B.

FIG. 4 is a diagram illustrating a sensing signal generator for generating a sensing signal that is applied to a duty ratio sensor of FIGS. 3A and 3B.

If an operation type of the duty ratio corrector 202 is a digital type, that is, if the duty ratio corrector 202 operates by determining whether levels of the correction signal are shifted or not, it is required to reset the correction signals A and B. Therefore, it is possible to increase the duty ratio sensing speed by reducing the cycle of the sensing signal EN after the level transition speed of the correction signals A and B become fast. The operation of determining whether the levels of the correction signals A and B are shifted or not will be described in detail with reference to FIG. 9 in later.

The sensing signal generator 401 outputs a sensing signal EN by reducing an enable period in response to the sensing speed control signal BW. Accordingly, if the duty ratio sensing speed increases, the level transition speed of the correction signals A and B also increase. Therefore, the duty ratio corrector 202 can quickly determine whether the levels of the correction signals A and B are shifted or not. Then, the level transition of the correction signals A and B can be determined by resetting the correction signals A and B to a high level. The sensing signal generator 401 increases a cycle of the sensing signal EN, that is, a frequency of the sensing signal EN in order to further quickly reset the correction signals A and B and in order to further quickly perform the sensing operation. That is, it is possible to sense the duty ratio further quickly if the enable period of the sensing signal EN is reduced as much as the increment of the level transition speed of the correction signals A and B.

The sensing signal generator 401 includes an oscillator for generating the sensing signal EN having a predetermined frequency, and a frequency controller 405 for outputting the sensing signal EN with the increased frequency in response to the sensing speed control signal BW.

When the sensing speed control signal BW is disabled to a low level, a PMOS transistor of the frequency controller 405 is turned on. In this case, an inverter and an NAND gate of the oscillator 403 are used. Therefore, the oscillator 403 outputs the sensing signal EN_1 with the predetermined frequency where a high level and a low level are regularly repeated.

When the sensing speed control signal BW is enabled to a high level, an NMOS transistor of the frequency controller 405 is turned on. In this case, one of an inverter and an NAND gate of the oscillator 403 is used. Therefore, the oscillator 403 generates a sensing signal EN_2 having a frequency higher than that of the sensing signal EN_1 which is generated when the sensing speed control signal BW is disabled. That is, the enable period of the sending signal EN_2 decreases compared with the enable period of the sensing signal EN_1.

Therefore, the duty ratio sensors 201A and 201B increases the sensing speed in the sensing speed increment mode by using the sensing signal EN_1 when the sensing speed control signal BW is disabled, and by using the sensing signal EN_2 when the sending speed control signal BW is enabled. When the sensing speed control signal BW is enabled to a high level, the sensing signal generator 401 outputs the sensing signal EN_2 by turning on a first pass gate 407 and turning off a second pass gate 409. When the sensing speed control signal BW is disabled, the sensing signal generator 401 outputs the sensing signal EN_1 by turning off the first pass gate 407 and by turning on the second pass gate 409.

Meanwhile, the sensing signal generator 401 may not include the oscillator 403 in another embodiment of the present invention. That is, the sensing signal generator 401 may generate a sensing signal EN that resets the correction signals A and B after determining the level transition of the correction signals A and B in another embodiment of the present invention.

Figure 5:
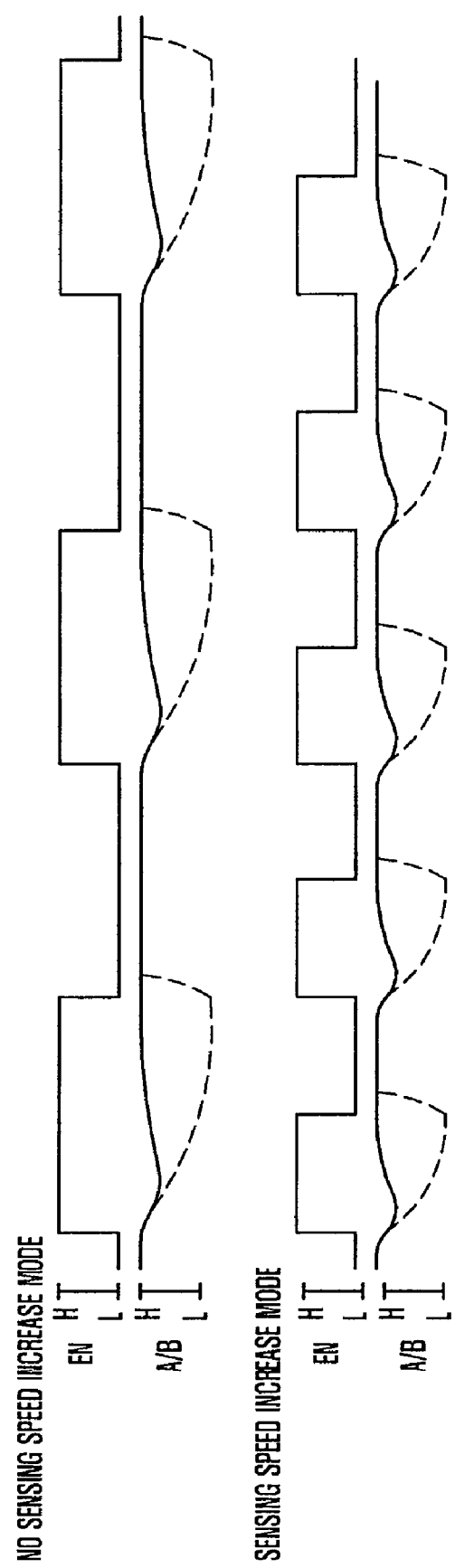
FIG. 5 is a timing diagram illustrating an operation of a duty correction circuit in accordance with an embodiment of the present invention.

FIG. 5 is a waveform of a correction signal according to a frequency of a sensing signal.

As shown in FIG. 5, the correction signals A and B are shifted to the opposite level, and the sensing signal EN is enabled and disabled alternately every period in a normal mode. When the sensing signal EN is disabled, the correction signals A and B are reset to a high level. In FIG. 5, a solid line denotes the correction signal A and a dotted line indicates the correction signal B.

In the sensing speed increment mode, the level transition speed of the correction signals A and B increases by the sensing speed controllers 303 and 309. That is, the correction signals A and B are shifted to the opposite level in a shorter time than that in the normal mode. The sensing signal generator 401 outputs a sensing signal EN with a shortened cycle. Therefore, the duty ratio sensors 201A and 201B sense the duty ratio faster by resetting the correction signals A and B as faster as the level transition of the correction signals A and B.

Figure 6:
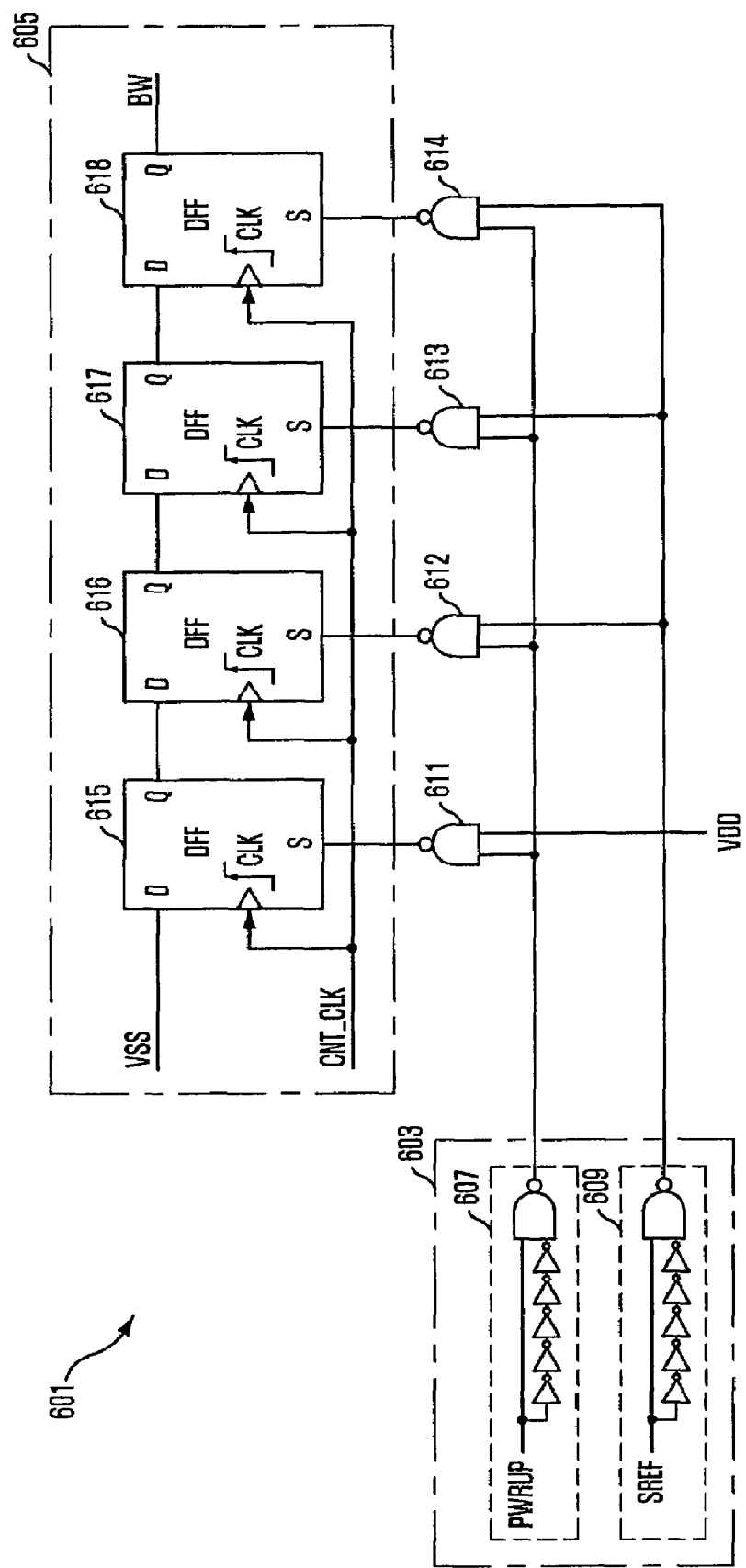
FIG. 6 is a diagram illustrating a sensing speed control signal controller for controlling a sensing speed control signal for a predetermined duration.

FIG. 6 is a diagram illustrating a sensing speed control signal controller 601 for controlling a sensing speed control signal BW for a predetermined duration.

The sensing speed control signal generator 601 outputs the sensing speed control signal BW that increases the duty ratio sensing speed of the duty ratio sensors 201A and 201B during a predetermined time in the sensing speed increment mode. That is, the sensing speed control signal generator 601 increases the sensing speed of the duty ratio sensors 201A and 201B for the predetermined time in the sensing speed increment mode.

As shown in FIG. 6, the sensing speed control signal controller 601 includes a pulse generator 603, a shift register 605, and NAND gates 611 to 614. The pulse generator 603 generates a first pulse signal having sensing speed increment mode information. The shift register 605 is set and shifted to a high level by the first pulse signal and generates the sensing speed control signal BW for the predetermined time. The NAND gates 611 to 614 transfer the first pulse signal to the shift register 605. The shift register 605 may be formed as a D flip-flop DFF.

The power up pulse generator 607 generates a low level pulse having the sensing speed increment mode information when a power up signal PWRUP is inputted. At this moment, the self-refresh signal SREF is a low level. Therefore, a high level is continuously outputted by the self-refresh pulse generator 609. Accordingly, the output signals of the NAND gates 611 to 614 have a high level, and a SET signal is inputted to the flip-flops 615 to 618 of the shift register 605. Then, the shift register 605 is shifted in a right direction by the clock CLKOUT and outputs a high level signal. Here, the output times of the high level signal is decided by the shifting times. Since the shift register 605 shifts four times using four flip-flops 615 to 618, the sensing speed control signal BW is enabled to a high level for four cycles of the clock CLKOUT outputted from the duty ratio corrector 202.

Meanwhile, the self-refresh pulse generator 609 generates a low level pulse having information on the sensing speed increment mode when a high level self-refresh signal SREF inputs. Here, a power up signal PWRUP is a low level signal. Therefore, the power up pulse generator 607 outputs a high level signal. Accordingly, the NAND gate 611 outputs a low level signal by a high level signal VDD applied to one end thereof and the high level output of the power up pulse generator 607 applied to the other end. The output signal of the NAND gates 612 to 614 have a high level by the high level output of the power up pulse generator 607 and the high level output of the self refresh pulse generator 609. Also, flip-flops 616 to 618 of the shift register 605 receive a SET signal. Unlike the inputting of the power up signal, the self-refresh signal is inputted to only three NAND gates 612 to 614, and three shifting occur using three flip-flops 616 to 618.

However, the present invention is not limited to the number of shifting times may be set in various numbers according to the design of the sensing speed control signal generator 601.

When the power up signal PWRUP or the self refresh signal SREF is not applied, the outputs of the NAND gates 611 to 614 have high levels because two output signals of the pulse generator 603 have high levels. Therefore, the SET signal is not inputted to the flip-flops 615 to 618. Since VSS is applied to the shift register 605, the sensing speed control signal BW is disabled to a low level when the SET signal is not inputted.

Figure 7:
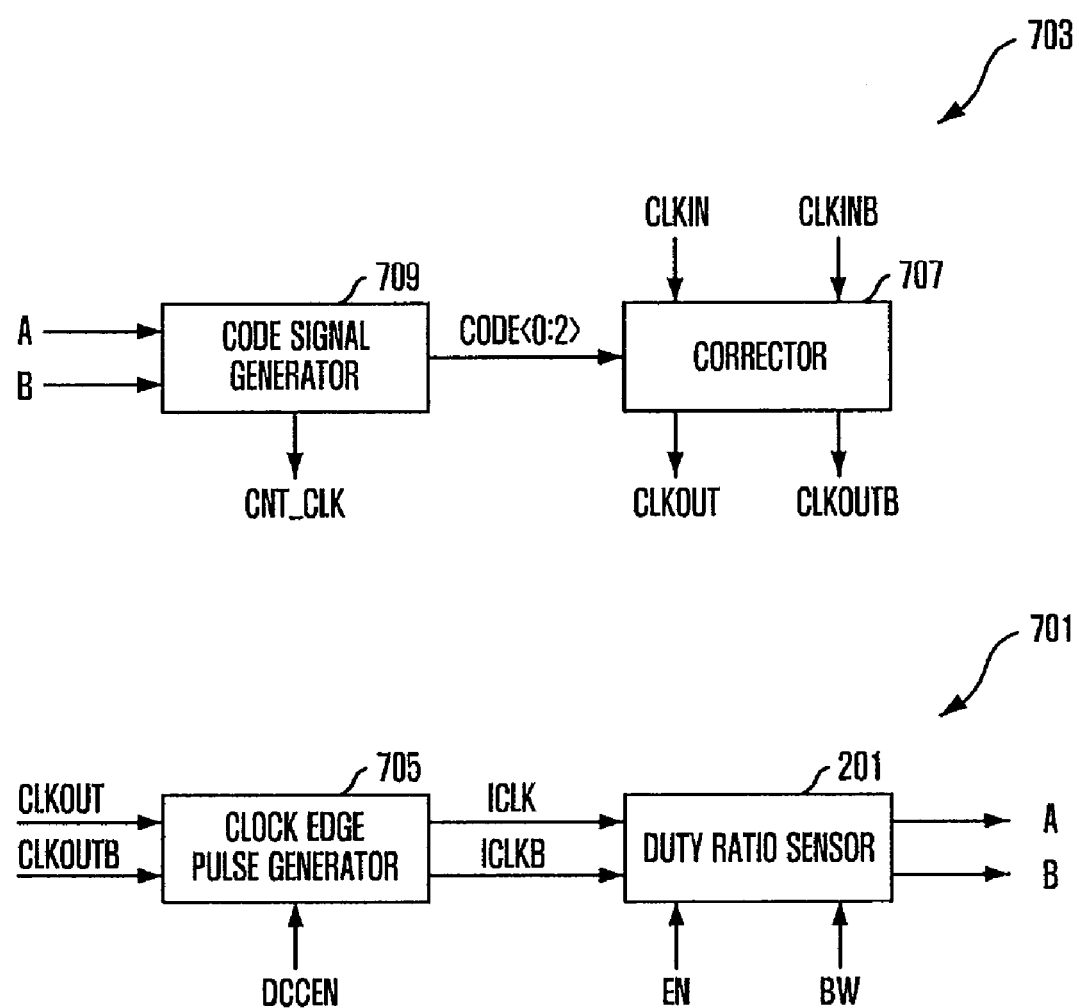
FIG. 7 is a block diagram illustrating a duty correction circuit in accordance with another embodiment of the present invention.

FIG. 7 is a block diagram illustrating a duty correction circuit in accordance with another embodiment of the present invention.

As shown in FIG. 7, the duty correction circuit according to another embodiment includes a duty ratio sensor 701 and a duty ratio corrector 703. The duty ratio sensor 701 further includes a clock edge pulse generator 705 that generates a reference clock signal ICLK and an inverted reference clock signal ICLKB corresponding to a width between rising edges of the clock CLKOUT and the complementary clock CLKOUTB. In the present embodiment, the clock CLKIN is a pulse signal having information on a rising edge of the reference clock signal ICLK and the complementary clock CLKINB is a pulse signal having information on a falling edge of the reference clock signal ICLK.

That is, the reference clock signal ICLK is a clock signal that is enabled at a rising edge of the clock and disabled at a rising edge of the complementary clock.

Since the DDR synchronous memory device inputs and output data not only at a rising edge of a reference clock signal ICLK but also a falling edge thereof, it is possible to input and output data only using a signal having information on a rising edge and a falling edge of a reference clock signal ICKL.

The duty ratio corrector 703 corrects the clock CLKIN and the complementary clock CLKINB by applying different delay to make the clock and the complementary clock to have a phase difference of 180°. Although the duty ratio corrector of FIG. 7 is similar to that of FIG. 2, the duty ratio corrector 703 corrects the phase difference between the clock CLKOUT and the complementary clock CLKINB using the clock CLKIN having information on a rising edge of the reference clock signal ICLK and the complementary clock CLKINB having information on a falling edge of the reference clock signal ICLK. Therefore, the duty ratio is corrected by converting the clock CLKIN and the complementary clock CLKINB to the reference clock signal ICLK.

As described above, the duty ratio corrector of FIG. 7 corrects the rising edges of the clock CLKIN and the complementary clock CLKINB to have a phase difference of 180°. Since the phase difference of 180° between the rising edges of the clock CLKIN and the complementary clock CLKINB means 50% of a duty ratio. Therefore, the duty ratio corrector of FIG. 7 may be equivalent to the duty correction circuit although the duty ratio corrector of FIG. 7 corrects the duty ratio to 50% because the duty ratio corrector of FIG. 7 corrects the rising edges of the clock CLKIN and the complementary clock CLKINB to have the phase difference of 180°.

When the clock edge pulse generator 705 generates the reference clock signal ICLK and the inverted reference clock signal ICLKB of the clock CLKOUT and the complementary clock CLKOUTB, the duty ratio sensor 201 senses the reference clock signal ICLK and the inverted reference clock signal ICLKB. The duty ratio sensor 201 outputs the correction signals A and B after sensing the duty ratio. In case of the sensing speed increment mode, the sensing speed controller 303 increases a sensing speed of the duty ratio sensor 201 by increasing the amount of current flowing to the duty ratio sensor 201.

In the present embodiment, the duty ratio corrector 703 is controlled in a digital manner by a binary code generated by determining whether the correction signals A and B are shifted to the opposite levels as shown in FIG. 3. Therefore, the duty ratio corrector 703 includes a code signal generator 709 and further increases the duty ratio sensing speed by the sensing signal generator 401.

The code signal generator 709 receives the correction signals A and B and generates a second pulse signal by recognizing whether the logical levels of the correction signals A and B are shifted to the opposite levels. The code signal generator 709 converts the correction signals A and B to a binary code by counting the second pulse signal using a counter in order to turn on or off a transistor for controlling delay in consideration of relation with the corrector 707.

Figure 8:
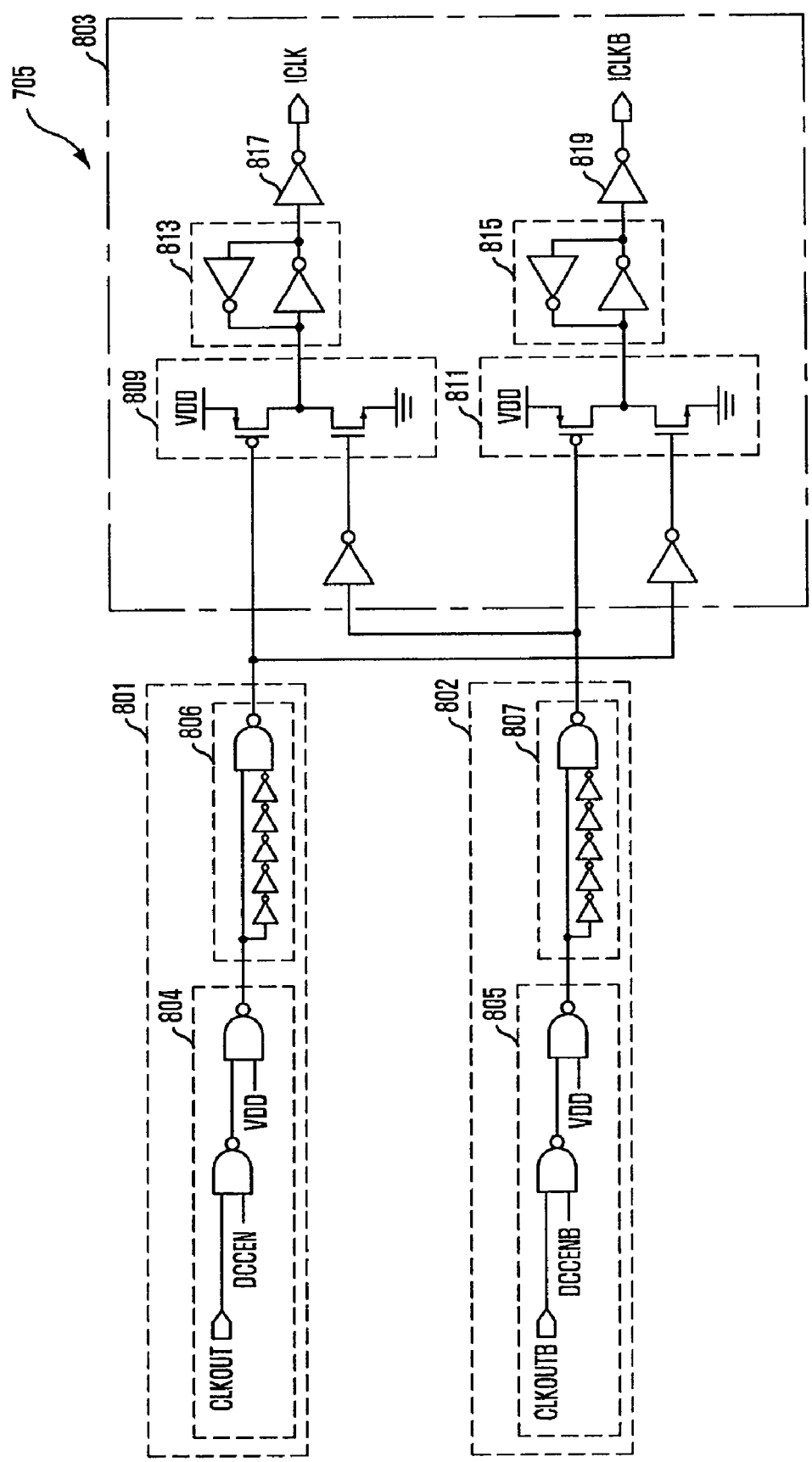
FIG. 8 is a diagram illustrating a clock edge pulse generator of FIG. 7.

FIG. 8 is a diagram illustrating a clock edge pulse generator of FIG. 7.

As shown in FIG. 8, the clock edge pulse generator includes a first signal input unit 801, a second signal input unit 802, and a signal output unit 803. The first signal input unit 801 generates a rising pulse signal at a rising edge of the clock CLKOUT in order to extract information on a rising edge of a reference clock signal after receiving the clock CLKOUT. The second signal input unit 802 generates a falling pulse signal at a rising edge of a complementary clock CLKOUTB in order to extract information on a falling edge of a reference clock signal after receiving the complementary clock CLKOUTB. The signal output unit 803 outputs the reference clock signal and the inverted reference clock signal using the information on the pulse signals of the first and second signal input units 801 and 802.

The first signal input unit 801 includes a first NAND gate end 804 for receiving the clock CLKOUT and a duty ratio correction enable signal DCCEN and a rising pulse generator 806 for generating a rising pulse signal of a low level by receiving the output signal of the first NAND gate end 804. The second signal input unit 802 includes a second NAND gate end 805 for receiving the complementary clock CLKOUTB and the duty ratio correction enable signal, and a falling pulse generator 807 for generating a low level falling pulse signal by receiving the output signal of the second NAND gate end 805. The signal output unit 803 includes first and second inverters 809 and 811 for receiving the rising and falling pulse signal, first and second latches 813 and 815 for sustaining logical levels of output signals of the first and second inverters, and third and fourth latches 813 and 819 for inverting the output signals of the first and second latches 813 and 815.

The rising and falling pulse generators 806 and 807 receives the clock CLKOUT and the complementary clock CLKOUTB with the duty ratio correction enable signal DCCED through the first and second NAND gate ends 804 and 805. The rising and falling pulse generators 806 and 807 generate low level rising and foaling pulse signals from the rising edges of the clock CLKOUT and the complementary clock CLKOUTB. At first, at the rising edge of the clock, a PMOS transistor of the first inverter 809 and an NMOS transistor of the second inverter 811 are turned on.

Accordingly, the reference clock signal ICLK is outputted as a high level signal through the first latch 813 and the third inverter 817, and the inverted reference clock signal ICLKB is outputted as a low level signal through the second latch 815 and the fourth inverter 819. At a rising edge of the complementary clock CLKOUTB, an NMOS transistor of the first inverter 809 and a PMOS transistor of the second inverter 811 are turned on. Therefore, the reference clock signal ICLK is outputted as a low level signal, and the inverter reference clock signal ICLKB is outputted as a high level signal.

The clock edge pulse generator 705 outputs a high level signal from a rising edge of the clock CLKOUT having information on the rising edge of the reference clock signal ICLK to the rising edge of a complementary clock CLKOUTB having information on a falling edge of the reference clock signal ICLK. Also, the clock edge pulse generator 705 outputs a low level signal from a rising edge of the complementary clock to the rising edge of the clock CLKOUT, thereby generating the reference clock signal ICLK. Therefore, if the phase difference between the rising edges of the clock CLKOUT and the complementary clock CLKOUTB is not 180°, widths of the high level and the low level of the rising and falling pulse signals ICLK and ICLKB becomes different.

Here, the first and second latches 813 and 815 sustain levels of the reference clock signal and the inverted reference clock signal ICLK and ICLKB between the rising edges of the clock CLKOUT and the complementary clock CLKOUTB.

Figure 9:
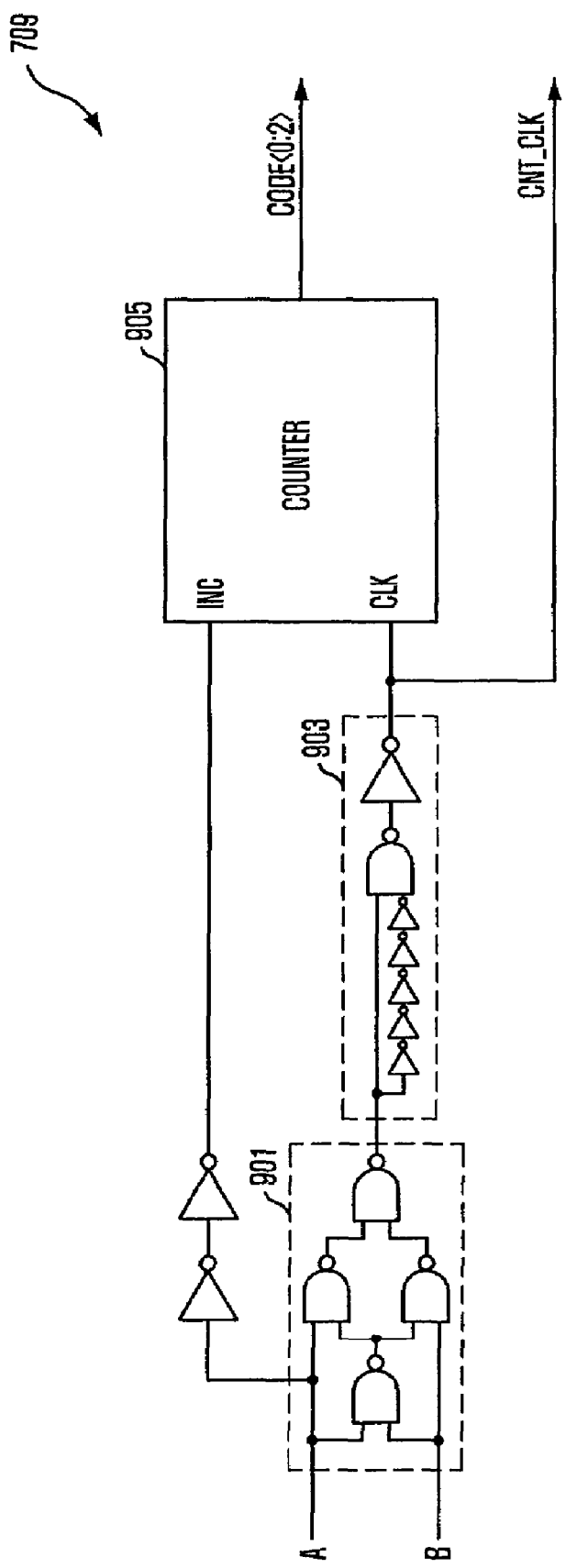
FIG. 9 is a diagram illustrating a code signal generator of FIG. 7.

FIG. 9 is a diagram illustrating a code signal generator of FIG. 7.

If logical levels of the correction signals A and B become opposite to each other, the output of the XOR unit 901 transits from a low level to a high level. Then, the second pulse generator 903 receives the high level signal and generates a high level pulse signal CNT_CLK. The up/down counter 905 and the sensing speed control signal generator 601 receives the pulse signal CNT_CLK. The up/down counter 905 decides counting up or down according to an input signal INC, is triggered at the rising edge of the pulse signal CNT_CLK, and performs a counting operation. The up/down counter 905 outputs a binary code correction signal code<0:2>. The corrector 707 receives the binary code correction signal code<0:2> and turns on or turns off the transistor.

The shift register 605 performs a shifting operation in response to the pulse signal CNT_CLK inputted to the sensing speed control signal generator 601 of FIG. 6.

Although a 3-bit up/down counter is used in the present embodiment, the present invention is not limited thereto. Various counters may be used according to the design of the code signal generator 709.

Figure 10:
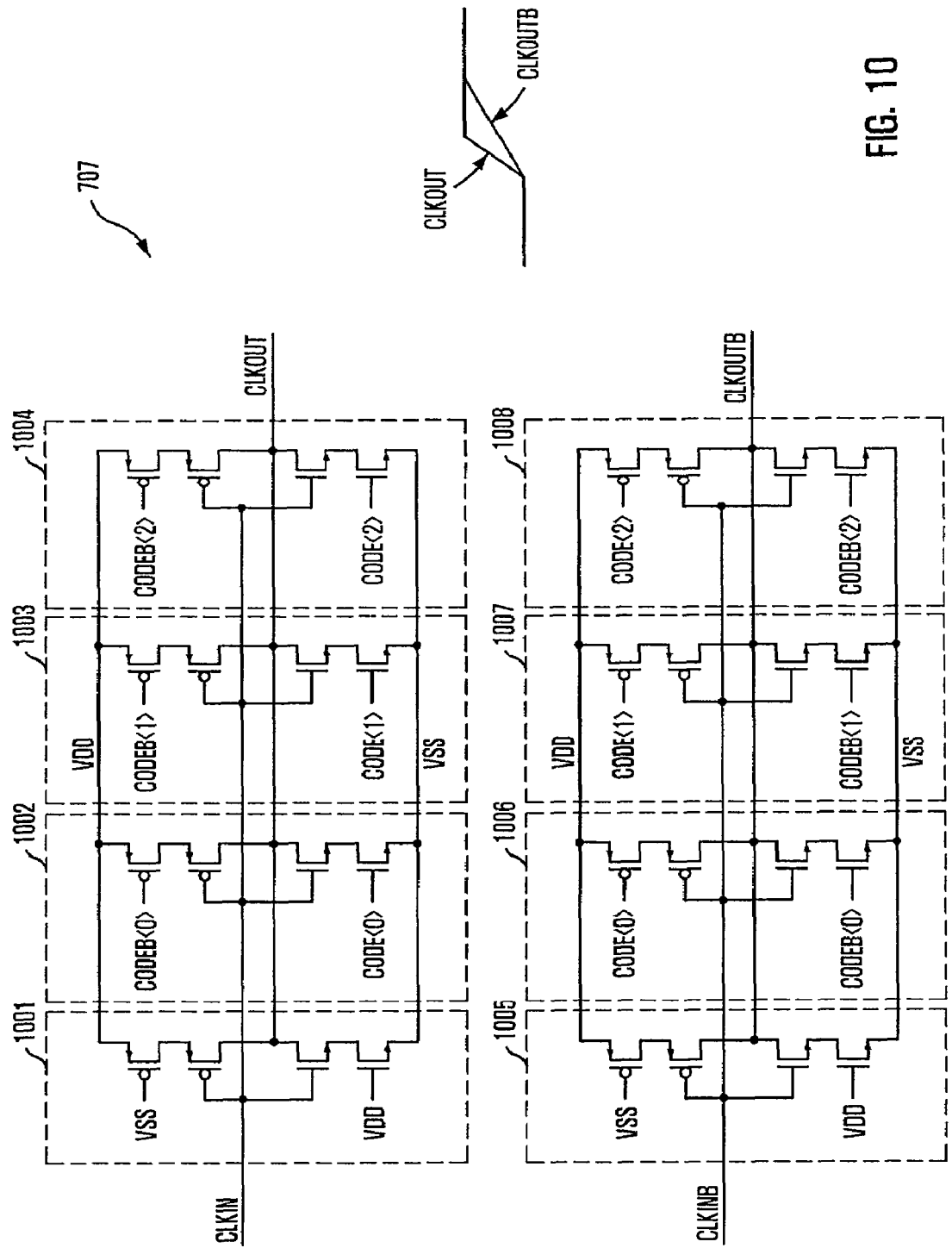
FIG. 10 is a diagram illustrating a corrector of FIG. 7.

FIG. 10 is a diagram illustrating a corrector 707 of FIG. 7.

Referring to FIG. 10, the corrector 707 includes a plurality of delays 1001 to 1003 connected in parallel for passing a clock CLKIN and a plurality of delays 1004 to 1008 connected in parallel for passing a complementary clock CLKINB. Each of the delays 1001 to 1008 includes an inverter structure which is operated by a binary correction signal code<0:2> and an inverted correction signal codeb<0:2> thereof. Transistors of the first and fifth delays 101 and 1005 are always turned on, and transistors of the second, third, fourth, sixth, seventh, and eighth delays 1002, 1003, 1004, 1006, 1007, and 1008 are turned on and turned off by the binary code of correction signal code<0:2> from the code signal generator 709. Also, the second, third, and fourth delays 1002, 1003, and 1004 have a complementary structure compared with those of the sixth, seventh, and eighth delays 1006, 1007, and 1008. For example, when the transistor of the second delay unit 1002 is turned on, the transistor of the seventh delay 1006 is turned off.

Since one side having more operating delays 1001 to 1008 has a stronger driving force than the other side, the clock is shifted faster than the other side. That is, a phase difference between rising edges of the clock CLKIN and the complementary clock CLKINB is corrected to 180° by inducing a delay difference between one side having more operating delays and the other side having less operating delays.

For example, the clock CLKOUT is shifted faster than the complementary clock CLKOUTB if more delays in the delays 1001 to 1004 which pass the clock CLKOUT exist than delays in the delays 1005 to 1008 which pass the complementary clock CLKINB.

Figure 11:
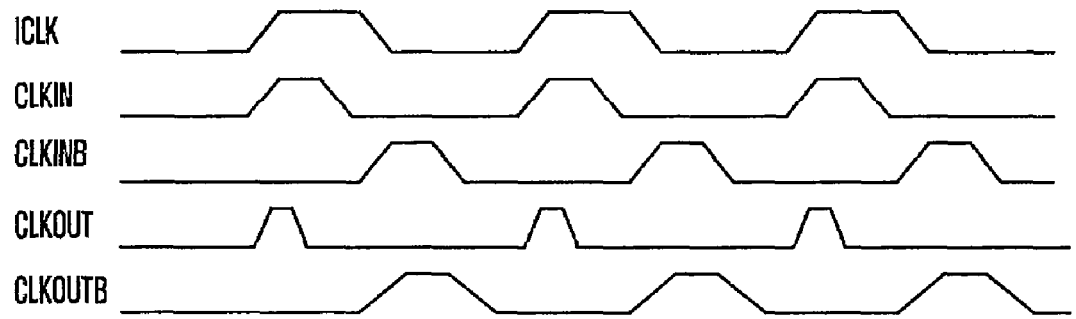
FIG. 11 is a timing diagram for describing operation of a duty correction circuit of FIG. 7.

FIG. 11 is a timing diagram for describing operation of a duty correction circuit of FIG. 7.

As shown in FIG. 11, a phase difference between rising edges of the clock CLKIN and the complementary clock CLKINB is not 1800. Therefore, the clock edge pulse generators 705 of FIGS. 7 and 8 generates a reference clock signal and an inverted reference clock signals ICLK and ICLKB having a duty ratio of not 50%. Then, the duty ratio sensor 201 transits the correction signals A and B to have the other logical levels according to the duty ratio of the reference clock signal and the inverted clock signal ICLK and ICLKB.

Still referring to FIG. 11, the logical level of the first correction signal A transits to a high level, and the logical level of the second correction signal B transits to a low level because a width of the high level period of the reference clock signal ICLK is narrower than that of the low level period.

In this case, the phase difference of rising edges can be adjusted to 180° by reducing the delay of the clock CLKIN and delay of the complementary clock CLKINB. If an initial value of the up/down counter 905 is set to 000 in an initial stage, transistors of the delays 1002 to 1004 passing the clock CLKIN are turned off, and transistors of the delay unit 1006 to 1008 passing the complementary clock CLKINB are turned on. The binary code correction signal code<0:2> by the input signal inc of the up/down counter 905 is up-counted like 001, 011, and 111, and the transistors of the delays 902 to 904 (not shown) passing the clock CLKIN are turned on one-by-one, and the transistors of the delays 1006 to 1008 are turned off one-by-one. By the driving force difference of inverters, the delay of the clock CLKIN decreases, and the delay of the complementary clock CLKINB increases. Accordingly, the phase difference of the rising edges of the clock CLKOUT and the complementary clock CLKOUTB decreases to 180°.

Figure 12:
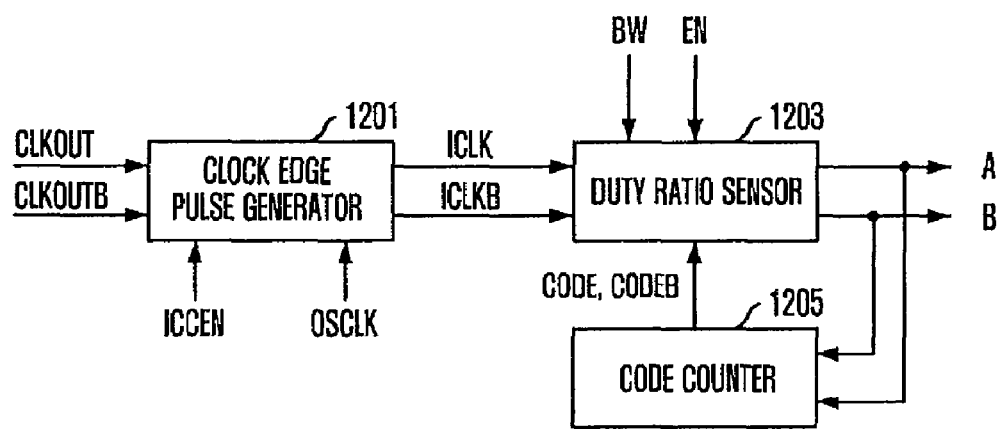
FIG. 12 is a block diagram illustrating a duty correction circuit in accordance still another embodiment of the present invention.

FIG. 12 is a block diagram illustrating duty correction circuit according to another embodiment of the present invention.

As shown in FIG. 12, the duty correction circuit according to the present embodiment further includes an offset correction circuit with the same constituent elements of the duty correction circuit of FIG. 7. Although a semiconductor device is preciously manufactured, offset may be generated by variations of environmental factors such as voltage levels and temperatures. Such an offset becomes significant as a semiconductor device becomes more integrated or operates in a fast speed. The duty correction circuit according to the present embodiment can correct such an offset.

The clock edge pulse generator 1201 receives a common clock signal OSCLK and generates two pulse signals ICLK and ICLKB for correcting an offset. Here, an offset correction operation is enabled by an offset correction enable signal ICCEN. The common clock signal osclk is a signal inputted to the first and second signal input units 801 and 802 for analyzing whether an offset is generated or not.

Since the reference clock signal and the inverted reference clock signal ICLK and ICLKB are generated based on the common clock signal OSCLK, if waveforms of the reference clock signal and the inverted reference clock signal ICLK and ICLKB are identical, there is no offset generated. If waveforms of the reference clock signal and the inverted reference clock signal ICLK and ICLKB are not identical, it means the existence of the offset.

The duty ratio sensor 1203 receives the reference clock signal and the inverted reference clock signal ICLK and ICLKB and generates correction signals A and B corresponding to a duty ratio. If the offset is not present, the reference clock signal and the inverted reference clock signal ICLK and ICLKB are identical in the waveform, that is, a pulse width. Therefore, the duty ratio sensor 1203 generates the same correction signals A and B. However, if the offset is present, the pulse widths of the reference clock signal and the inverted reference clock signal ICLK and ICLKB are different. Therefore, the duty ratio sensor 1203 generates different correction signals A and B.

A code counter 1205 senses a difference between the different correction signals A and B when the offset exists and outputs binary code signals CODE, CODEB to the duty ratio sensor 1203 for correcting the difference of the correction signals A and B. The code counter 1205 increases or decreases the binary codes CODE and CODEB according to the difference between the correction signals A and B and fixes the binary code signals code and codeb if the correction signals A and B are identical or have a bang bang error. Since the binary code signals CODE and CODEB are not a continuous value, it is difficult to accurately match the correction signals A and B. If the correction signals A and B have the bang bang error, it is determined as offset corrected.

For example, the code counter 1205 may be a tracking type AD converter, which is well-known to those skilled in the art. In this case, the tracking type AD converter traces a difference between the correction signals A and B by the offset and up or down counts until the correction signals A and B have identical or a bang bang error, and outputs a binary code signal CODE and CODEB.

The duty ratio sensor 1203 corrects an offset in order to make the correction signals A and B to have the same value or the bang bang error by making an amount of current flowing to output ends of the correction signals A and b to be different based on the binary code signals code and codeb.

After correcting the offset, a duty ratio correction operation is performed. In case of a self-refresh mode or a power-up mode, it is better to correct the duty ratio quickly. In this case, the sensing speed control signal BW enables the sensing speed controller 303 and the sensing signal generator 401 to increase the sensing speed of the duty ratio sensor 1203.

The offset correction enable signal iccEN inputted to the clock edge pulse generator 1201 is a signal that activates an offset correction operation.

Figure 13:
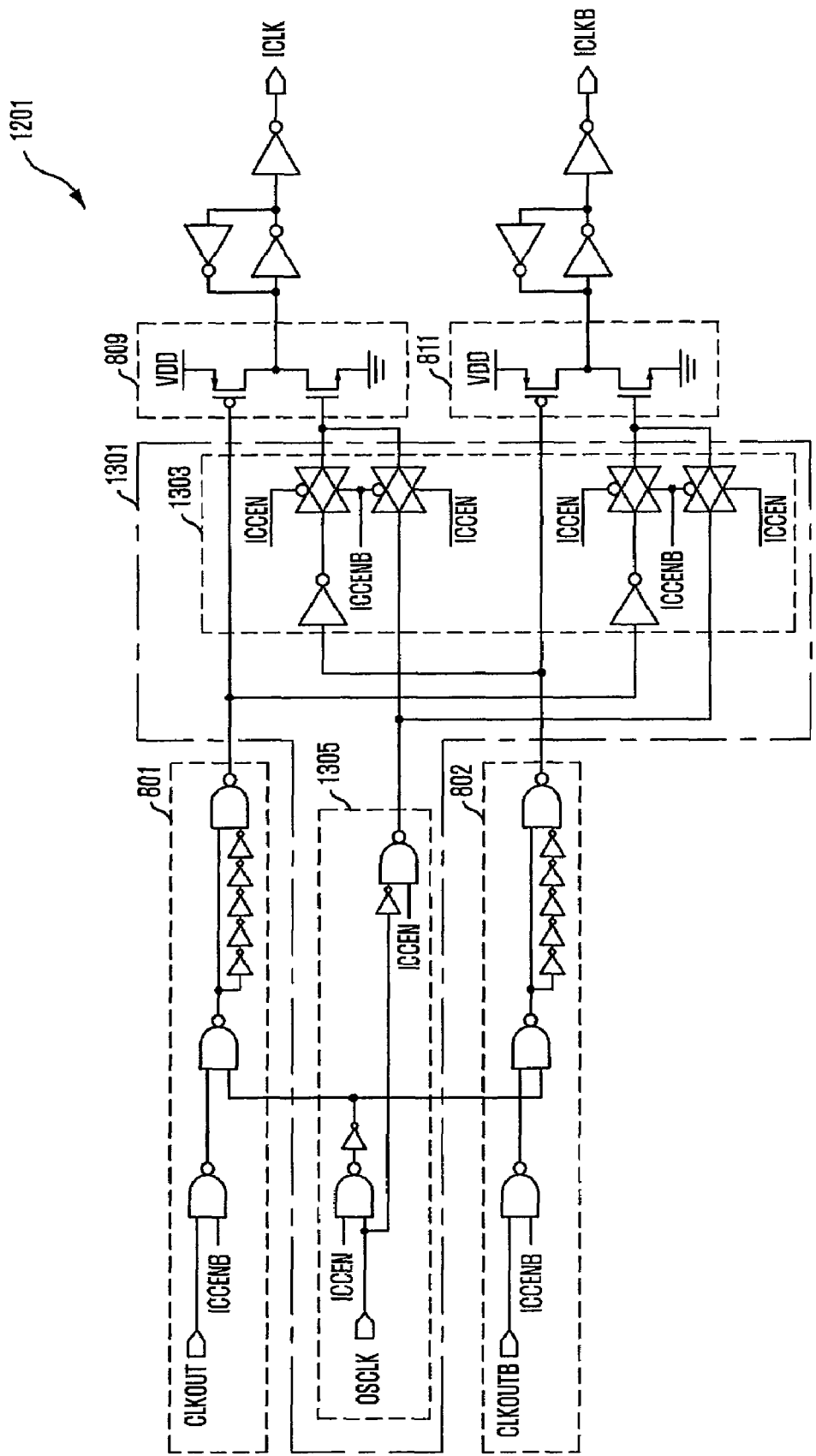
FIG. 13 is a diagram illustrating a clock edge pulse generator of FIG. 12.

FIG. 13 is a diagram illustrating a clock edge pulse generator of FIG. 12.

The clock edge pulse generator further includes an offset pulse generator 1301 with the same constituent elements of the clock edge pulse generator 705 of FIG. 8.

A common clock signal OSCLK is inputted to the first and second inverters 809 and 811 through the offset pulse generator 1301 by the offset correction enable signal ICCEN. The offset pulse generator 1301 applies the same signal to each of the output ends of the clock edge pulse generator 1201, such as the first and second inverters 809 and 811 in order to make the reference clock signal ICLK and the inverted reference clock signal ICLKB to have the same clock signal of the common clock signal OSCLK.

The pass gate 1303 passes the output of the third signal input unit 1305 in order to correct an offset by the offset correction enable signal ICCEN in the offset correction operation. After the offset correction operation, the pass gate 1303 passes the output signals of the first and second signal input units 801 and 802 for correcting a duty ratio.

The clock edge pulse generator 1201 corrects a duty ratio like the clock edge pulse generator 705 of FIG. 8 after correcting the offset.

Figure 14:
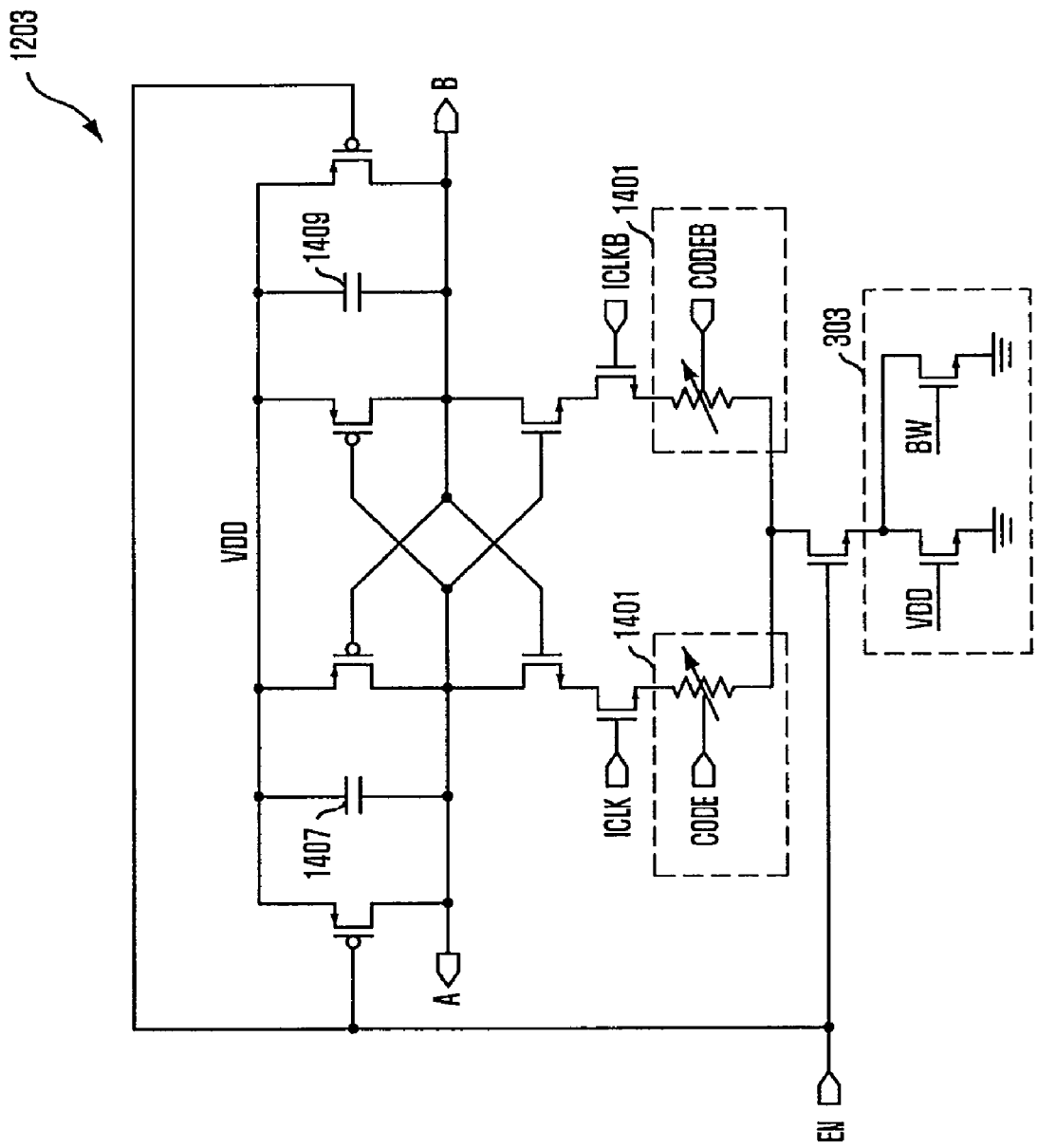
FIG. 14 is a diagram illustrating a duty ratio sensor of FIG. 12.

FIG. 14 is a diagram illustrating a duty ratio sensor of FIG. 12.

Referring to FIG. 14, the duty ratio sensor according to the present embodiment further include an offset corrector 1401 with the same constituent elements of the duty ratio sensor 201 of FIG. 7. It is difficult to correct an offset by matching the reference clock signal ICLK with the inverted reference clock signal ICLKB when the reference clock signal ICLK and the inverted reference clock signal ICLKB of the clock edge pulse generator 1201 are not matched by the offset. Since matching the correction signals A and B by the reference clock signal and the inverted reference clock signal ICLK and ICLKB having the offset is equivalent to the reference clock signal and the inverted reference clock signal without offset, the offset can be corrected by matching the correction signals A and B.

The offset corrector 1301 corrects an offset by controlling a charging and discharging speed of capacitors 1407 and 1409 connected to the output end of the duty ratio sensor 1203. For example, a correction signal A becomes different from a correction signal B when a high level period of the inverted reference clock signal ICLKB is wider than a high level period of the reference clock signal ICLK. Since the logical level of the second correction signal B is dropped more than that of the first correction signal A in an initial stage, the offset corrector 1401 increases a resistance value of an output end of the second correction signal B and reduce the amount of current flowing to the capacitor 1409 by slowing down the charging/discharging speed of the sub capacitor 1409. On the contrary, the offset corrector 1401 increases the amount of current flowing to the capacitor 1407 by reducing the resistance value of the output end of the first correction signal A. Therefore, the level transition speed of the first correction signal A increases, and the level transition speed of the second correction signal B decreases, thereby making the correction signals A and B to be matched or to have a bang bang error. That is, the offset corrector 1401 corrects the offset.

The offset corrector 1401 according to the present embodiment includes a variable resistor that controls a resistance value. The offset corrector 1401 controls the resistance value of the variable resistor and controls the amount of current.

Embodiments of the present invention relate to a duty correction circuit for dynamically controlling a duty ratio sensing speed to increase or decrease a duty ratio sensing speed as occasion demands. Therefore, the duty correction circuit according to the present invention can stably sustain the system performance and reduce instability and jitter by increasing a duty ratio sensing speed in a particular mode and sustaining an original duty ratio sensing speed in a normal mode.

While the present invention has been described with respect to the specific embodiments, it will be apparent to those skilled in the art that various changes and modifications may be made without departing from the spirit and scope of the invention as defined in the following claims.

What is claimed is:

1. A duty correction circuit, comprising:
   a duty ratio sensor for controlling a duty ratio sensing speed by a sensing speed control signal and outputting a correction signal by sensing a duty ratio of a clock; and
   a duty ratio corrector for controlling the duty ratio of the clock in response to the correction signal.

2. The duty correction circuit of claim 1, wherein the correction signal is charged/discharged and enabled in response to a clock or a complementary clock, and an amount of current flowing to the duty ratio sensor is controlled by the sensing speed control signal.

3. The duty correction circuit of claim 2, wherein the duty ratio sensor includes:
   a charging/discharging unit for charging/discharging a charge storing unit according to the duty ratio of the clock and generating the correction signal;
   a charge storing unit charged or discharged by being connected to an output end of the duty ratio sensor and controlling a logical level shifting speed of the correction signal; and
   a sensing speed controller for controlling a charging/discharging speed of the charge storing unit by controlling the amount of current flowing to the duty ratio sensor in response to the sensing speed control signal.

4. The duty correction circuit of claim 3, wherein the sensing speed controller increases the amount of current flowing to the duty ratio sensor when the sensing speed control signal is enabled.

5. The duty correction circuit of claim 2, wherein the duty ratio sensor further includes:
   a sensing signal generator for generating a sensing signal that enables the duty ratio sensor and reducing an enable period of the sensing signal in response to the sensing speed control signal; and
   a reset unit for resetting the correction signal at a disable period of the sensing signal.

6. The duty correction circuit of claim 5, wherein the sensing signal generator includes:
   an oscillator for generating the sensing signal having a predetermined frequency; and
   a frequency controller for outputting the sensing signal by increasing the predetermined frequency in response to the sensing speed control signal.

7. The duty correction circuit of claim 2, further including a sensing speed control signal controller for increasing a sensing speed of the duty ratio sensor for a predetermined time and outputting the sensing speed control signal in case of a sensing speed increment mode.

8. The duty correction circuit of claim 7, wherein the sensing speed control signal controller includes:
   a pulse generator for generating a first pulse signal having the sensing speed increment mode information; and
   a shift register for generating the sensing speed control signal for the predetermined time, which is set up and shifted to a high level by the first pulse signal.

9. The duty correction circuit of claim 7, wherein the duty ratio correction circuit enters the sensing speed increment mode in an initial power up mode.

10. The duty correction circuit of claim 7, wherein the duty ratio correction circuit enters the sensing speed increment mode in a self-refresh mode.

11. The duty correction circuit of claim 1, wherein the duty ratio sensor includes a first charge storing unit charged or discharged in response to a clock, and a second charge storing unit charged or discharged in response to a complementary clock, the duty ratio sensor outputs the correction signal that is enabled in response to charge amounts of the first and second charge storing units, and the respective capacitances of the first and second charge storing units is controlled by the sensing speed control signal.

12. The duty correction circuit of claim 11, wherein the duty ratio sensor includes:
a charge/discharge unit for charging and discharging the first and second charge storing units according to a duty ratio of the clock and generating the correction signal;
the first and second charge storing units charged or discharged by being connected to an output end of the duty ratio sensor and controlling a logical level shifting speed of the correction signal; and
a sensing speed controller for controlling a sensing speed of the duty ratio sensor by controlling the respective capacitances of the first and second charge storing units in response to the sensing speed control signal.

13. The duty ratio correction circuit of claim 12, wherein the sensing speed controller increases the respective capacitances of the first and second charge storing units when the sensing speed control signal is enabled.

14. The duty ratio correction circuit of claim 11, wherein the duty ratio sensor further includes:
a sensing signal generator for generating a sensing signal that enables the duty ratio sensor and reducing an enable period of the sensing signal in response to the sensing speed control signal; and
a reset unit for resetting the correction signal in a disable period of the sensing signal.

15. The duty ratio correction circuit of claim 14, wherein the sensing signal generator includes:
an oscillator for generating the sensing signal having a predetermined frequency; and
a frequency controller for increasing the predetermined frequency in response to the sensing speed control signal and outputting the sensing signal.

16. A duty ratio correction circuit, comprising:
a duty ratio sensing unit having a duty ratio sensing speed controlled by a sensing speed control signal, for outputting a correction signal by sensing a width between rising edges of a clock and a complementary clock; and
a corrector for correcting the clock and the complementary clock to have a phase difference of 180° in response to the correction signal.

17. The duty ratio correction circuit of claim 16, wherein the duty ratio sensing unit includes:
a clock edge pulse generator for generating a reference clock signal that is enabled at a rising edge of the clock and disabled at a rising edge of the complementary clock, and for generating an inverted reference clock signal that is enabled at a rising edge of the complementary clock and disabled at a rising edge of the clock; and
a duty ratio sensor for controlling a sensing speed in response to the sensing speed control signal and outputting the correction signal in response to the reference clock signal and the inverted reference clock signal.

18. The duty ratio correction circuit of claim 17, wherein the correction signal is charged or discharged in response to the reference clock signal and the inverted reference clock signal, and an amount of current flowing to the duty ratio sensor is controlled by the sensing speed control signal.

19. The duty ratio correction circuit of claim 17, wherein the duty ratio sensor includes a first charge storing unit that is charged or discharged in response to the reference clock signal and a second charge storing unit that is charged or discharged in response to the inverted reference clock signal,
the duty ratio sensor outputs the correction signal that is enabled in response to charge amount of the first and second charge storing units, and
the respective capacitances of the first and second charge storing units is controlled by the sensing speed control signal.

20. The duty ratio correction circuit of claim 18, wherein the duty ratio correction circuit inputs a common clock signal to the clock edge pulse generator, compares output signals, and individually controls charging and discharging speeds to make the correction signal to be identical.

* * * * *